United States Patent [19]
Porter

[11] Patent Number: 5,808,866
[45] Date of Patent: Sep. 15, 1998

[54] RUGGEDIZED CONTAINER SYSTEM AND METHOD

[75] Inventor: Anthony W. Porter, Spring Valley, Calif.

[73] Assignee: GDE Systems, Inc., San Diego, Calif.

[21] Appl. No.: 711,143

[22] Filed: Sep. 9, 1996

[51] Int. Cl.$^6$ ............................... H05R 7/20; H05R 5/02
[52] U.S. Cl. .................. 361/695; 174/35 R; 211/41; 220/9.1; 220/699; 248/562; 361/703; 361/757; 361/816
[58] Field of Search ............................ 174/35 R; 211/41; 220/9.1, 669; 248/562; 361/679, 694–695, 704, 707, 724, 730, 732, 752, 757, 796–797, 800, 816, 818

[56] References Cited

U.S. PATENT DOCUMENTS

| | | | |
|---|---|---|---|
| 3,997,819 | 12/1976 | Eggert et al. ............................ | 361/704 |
| 4,002,955 | 1/1977 | Eggert et al. ............................ | 361/679 |
| 4,004,194 | 1/1977 | Doerflinger et al. .................... | 361/800 |
| 4,777,565 | 10/1988 | McIntosh ................................ | 361/816 |
| 5,160,357 | 11/1992 | Faber ....................................... | 361/695 |
| 5,202,815 | 4/1993 | Le Boennec et al. ................. | 174/35 R |
| 5,398,822 | 3/1995 | McCarthy et al. ...................... | 361/809 |
| 5,669,524 | 9/1997 | Loedel ..................................... | 220/9.1 |

*Primary Examiner*—Gregory D. Thompson
*Attorney, Agent, or Firm*—Neil D. Greenstein; Frederick J. Zustak

[57] ABSTRACT

The present invention relates to the packaging of commercial off-the-shelf (COTS) electronic modules and equipment for use in harsh military or commercial environments. The ruggedized container of this invention is a light-weight container weighing less than half of the weight of commercially available containers having similar functionalities and which is intended for use in similar harsh environments. The reduced weight and size of the ruggedized container of this invention are consistent with size and/or weight critical applications such as transport of portable flight line testers, submarines, space craft, air craft, and the like. The ruggedized container of this invention, comprises five major components: a transit case, a card cage, a vibration isolator assembly, cooling system, and power supply. Each element of the chassis is individually enhanced for size and weight. As a result, the combination of components is integrated to provide the characteristics such as light-weight and compactness, and the functionalities required by the harsh environments associated with particular military and commercial applications at a weight of substantially less than that of current commercially available containers.

41 Claims, 6 Drawing Sheets

RUGGEDIZED CONTAINER SYSTEM AND METHOD

TECHNICAL FIELD

This invention relates to a container system and method for packaging electronic equipment, and more particularly to a ruggedized packaging system for environmental isolation of sensitive electronic equipment including off-the-shelf components, and methods for providing shock and vibration isolation, and thermal control of an operating environment of sensitive electronic equipment in a light-weight, rugged container for use in a harsh, field environment.

BACKGROUND ART

Commercial off-the-shelf (COTS) electronic equipment is typically not intended for use in a harsh military, or otherwise high vibration, or temperature extreme environment. Versa Modula Europa (VME) electronic modules are available as off-the-shelf modules having standardized size, connectors, voltages, and number of connector pins. These modules can be combined to provide a variety of functionalities that are particularly useful in military and commercial environments. The specification for these modules, as well as for VXI modules having an enhanced or extended standards set, are not able to meet military specifications without being enclosed in a ruggedized container. In other words, the reliability of VME and VXI bus modular electronic circuits will depend on the ability of individual modules, as well as individual components mounted on circuit boards, inside a ruggedized container, to withstand severe vibration and rough handling, high levels of humidity, the presence of corrosive vapors such as salt spray, high levels of particulate contamination including dust and dirt, and temperature extremes.

An acute shock or prolonged vibration of an assembly of modular electronic circuits, may lead to fatigue in an electronic assembly. This causes failure of circuit connections and component leads. Where the vibration is at a resonant frequency of the electronic assembly structure, damage to the system may further occur as individual modules shake themselves loose from the backplane, or the accentuated flexing associated with a resonant vibration simply destroys connectivity to the backplane. An example of such an environment is the environment associated with flight line testing. Here, the electronics needed to test critical circuits in airplanes, helicopters and the like must be transported to the aircraft. The electronics may be subjected to rough handling and vibration as the electronics package is loaded and unloaded from a transport vehicle. The electronics package may have to be carried manually for some distance with the possibility of subjecting the container and enclosed electronics to significant vibration and physical shock prior to being set up for use. Also, the environment may be an aircraft carrier or some other facility close to salt water thus presenting the risk of corrosion.

High levels of dust and dirt can create a low resistance bridge between adjacent circuit board trace lines or alter the value of inductor coils. This may detrimentally affect the stability of high-frequency, or otherwise sensitive circuits on the circuit board, resulting in degraded performance of the overall electronics system. Further, the presence of dust and dirt in a modular circuit assembly may compromise the electrical connectivity reliability of modular circuit boards which are removably plugged into backplane sockets.

Additionally, temperature extremes can seriously impact the performance of modular electronic circuits in a variety of ways. Many electronic components, including capacitors, particularly electrolytic capacitor, and semiconductor devices are rated to operate in limited temperature ranges. Exceeding the temperature limits may result in component failure, catastrophic breakdown, inoperability, or irreversible changes in circuit performance, detrimentally affecting circuit functionality. Temperature extremes can reduce reliability of the connection of individual electrical components to associated solder traces of the circuit board. Different coefficients of expansion in adjacent dissimilar materials, e.g. solder, component leads, copper traces on a circuit board, and a circuit board substrate, plus repetitive thermal cycling between high and low temperature extremes can cause considerable stress in a modular circuit board, when thermal expansion and contraction occurs in particular materials adjacent to one another. Open circuits due to debonding consequently occur and circuit board de-lamination may result. Accordingly, there is a need to limit the temperature range to which electronic circuits enclosed within a ruggedized container may be subjected, with a minimum impact on container size and weight.

Many electronic and aerospace applications require substantial electromagnetic shielding of affected electronics to minimize emitted radiation which may interfere with external devices that are sensitive to radio frequency interference (RFI), or to prevent RFI of the enclosed electronic modules. Accordingly, current commercially available ruggedized containers for electronics may include a heavy, metal transit outer case to prevent RFI.

The need to have the capabilities of sensitive electrical equipment in a battlefield, submarine, aerospace vehicle, or otherwise harsh environment characterized by high shock and/or vibration, high contamination, or extreme temperature requires that sensitive electrical equipment be carefully protected. The current state of the art is to enclose the electronic circuits in multiple container layers including an intermediate, inner frame container layer. However, current containers for a COTS module are inadequate or unsuitable as failing to meet the requirements of small size (e.g., to fit in a limited space environment such as through a hatch on a submarine), and low weight.

Further, the weight of the packaging may be critical, for example, in a battlefield where the electronics package and the electronics must be sufficiently light to be carried and placed in a selected position by no more than two persons at the most. The packaging provided by containers currently known is generally heavy or bulky and not easily carried by two people. Further, a heavy or bulky package for electronics is inconsistent with the low weight and compactness requirements of certain applications. For example, there is no 13 card-slot ruggedized container capable of accomodating size C, VXI modules that can fit through the hatches of a submarine.

Tektronix Corporation, Beaverton, Oreg., and Hewlett-Packard Corporation, Palo Alto, Calif., manufacture VXI instrument electronics enclosures. These containers have internal fans for forced-air control for interior cooling and RFI shielding for electromagnetic compliance (EMC). These containers do not lend themselves for portable harsh environment applications in that they are not designed for outdoor use.

Also, the Tektronix and Hewlett-Packard containers do not provide for corrosive atmospheres, or high particulate contaminant level environments, as these containers use open-system, forced air cooling systems. Further, the front of the enclosures from these suppliers are either open or provide for the addition of an acrylic access door.

Importantly, the Tektronix and the Hewlett-Packard enclosures do not employ vibration isolators and, therefore, provide very limited vibration isolation or security from acute physical shock. Thus, current enclosures may not be suitable for harsh environments particularly environments characterized by high vibration levels and/or acute physical shock, and in particular, those applications and environments associated with corrosive atmospheres and demanding a need for portable (i.e., two person, or less, carry capability) applications.

Commercially available ruggedized containers are often typified by heavy, metallic outer transit cases, and a metal inner case. These containers may be heavy, requiring several men to lift them. A manufacturer of ruggedized enclosures for COTS electronic modules is Racal Instruments, Irvine, Calif. Racal manufactures a VXI-bus electronics enclosure having air-flow cooling capability, helical coils for shock and vibration attenuation, and RFI protection. The Racal enclosure includes an outer transit case and a metal inner frame to house the electronics. The inner frame provides mounts for a card cage which in turn provides mounts for the card-guides, or rails, and a backplane for mounting COTS electronics. The heavy weight of the metal inner frame and card cage requires heavy, metal-braid helical springs to suspend and isolate the inner frame and card cage from shock or vibration to which the outer case may be subjected. The Racal enclosure is very heavy, and is specified as weighing 115 pounds not including the VXI modules to be enclosed. This is too heavy for easy transport, thus, severely limiting its utility in a battlefield, or weight critical situation. Further, the heavy metal inner frame, and large helical isolators results in a container that is too large to be easily transported and fit through small passage ways and hatches, again significantly impacting the utility of the Racal container.

Accordingly there is a need for a compact, light-weight, ruggedized enclosure for COTS electronic modules capable of protecting the electronic modules from a harsh environment characterized by one or more of severe vibration, acute physical shock, salt atmosphere, particulate contamination, and high temperature. The enclosure, with the COTS modules mounted therein, would ideally weigh less than 88 pounds, a current standard for a two person lift requirement. A compact, lighter ruggedized container is also consistent with size and weight critical environments such as submarines, ships, and aircraft.

SUMMARY OF THE INVENTION

According to the present invention, a light-weight, ruggedized container system permits mounting of COTS electronic modules for operation in a harsh environment, including shock and vibration isolation, with internal air-flow for temperature control, protection from corrosive atmospheres and particulate contamination, and RFI shielding, with a container weight substantially less than the weight of commercially available containers having similar functionalities, and further permitting single-man transport and set-up.

A beneficial feature of the ruggedized container of this invention is a light-weight, non-metallic transit case that is comparable to the metallic transit case standard on commercially available, ruggedized containers, with respect to impact resistance, and shock and vibration dissipation, but is substantially lighter in weight. An additional beneficial feature of the ruggedized container of this invention is a light-weight, rigid card cage for mounting within the transit case. The card cage of this invention weighs substantially less than card cages from standard, commercially available, ruggedized containers.

The ruggedized container of this invention also features a shock and vibration isolation mounting system for mounting the card cage within the transit case to integrate the transit case as part of a light-weight ruggedized chassis without the need for an inner case or frame for supplemental support.

According to the present invention, the ruggedized container of this invention includes a light-weight, temperature control means capable of maintaining enclosure internal temperatures to no more than 12° C. above ambient temperatures.

According to the present invention, a method for protecting COTS electronic modules operating in a harsh environment is also provided.

According to the present invention, electronic modules and equipment is securely transportable for military and commercial applications under conditions of vibration and abrupt motion, and rough handling. The ruggedized container of this invention includes a light-weight chassis weighing substantially less than commercially available containers having similar functionalities including vibration and shock protection, particulate contamination protection, and controlled container temperature, and which are intended for use in similar harsh environments. The reduced weight and size of a ruggedized container according to the present invention permits use in size and/or weight critical applications such as the transportation of portable flight line testers, submarines, space craft and air craft, and the like.

According to one embodiment of this invention, the ruggedized container comprises multiple components, including a transit case, a card cage, a mounting assembly, a cooling system, and a power supply. Each component is individually enhanced for size and weight, and the combination is of cooperating components that are integrated to enable survival in harsh environments associated with particular military and commercial applications.

The materials used in the construction of the transit case significantly affect the overall weight of the ruggedized container. We have determined that a composite material, particularly a graphite-Kevlar composite, provided the best overall performance characteristics, including impact resistance and low weight, and is, therefore, a preferred material for construction of the transit case of this invention. Other composites, including fiberglass reinforced plastic, fiberglass reinforced composites (such as fiberglass-reinforced graphite-Kevlar composite), and thermostamped composite, may be used as well as alternate construction materials for the transit case. The preferred embodiment of the transit case includes a fiberglass-reinforced graphite-Kevlar composite.

The transit case of the ruggedized enclosure of our invention also includes metal coated polymer, preferably silver coated rip-stop nylon, incorporated into the composite for EMI protection. Other conductive materials, including but not limited to other metals for coating the polymer (e.g., nickel, chrome, gold, zinc, and copper), a conductive metal mesh, metal foil, or conductive paint may also be used to mitigate EMI.

According to the present invention, a major factor in weight reduction, aside from the construction material change, is the elimination of the inner frame. The inner frame is standard in commercially available containers and is used to provide additional structure and mechanical strength to the card cage, and to isolate the modules from shock and vibration. The ruggedized container of this invention includes a card cage having sufficient rigidity and mechanical strength so as to eliminate the need for an inner frame. The card cage of this invention is mounted directly to the shell of the transit case via shock isolators. The elimination of the inner frame makes the transit case an integral part of the chassis and results in a substantial weight reduction.

A novel feature of the present invention includes a card cage configuration and construction material that enhances both high strength and low weight, as compared to standard aluminum card cages. The card cage of the ruggedized container of this invention is fabricated from a foam-filled graphite epoxy structural laminate. The resulting weight for a thirteen card slot card cage is approximately four pounds. By comparison, a standard aluminum card cage typically weighs approximately twenty pounds. Any light-weight foam may be used including, but not limited to foamed polystyrene, polyurethane, latex, and the like. Other laminates including laminates constructed from Kevlar, fiberglass, nylon, hollow polymer fibers, and fiber reinforced plastics, fiber reinforced composites, and the like, may be used as well, preferably in combination with the foam to provide a high-strength foam-core composite laminate structure, or alternately, without a foam core.

The novel construction of the card cage of this invention takes advantage of the light-weight, high strength characteristics of the construction materials used. Ventilated panels are located on the top and bottom of a skeletal composite framework, and are constructed from either corrugated panels or flat panels. The ventilated, corrugated panels impart enhanced stiffening, low weight, and improved airflow characteristics to the card cage, as compared to the ventilated flat panels, whereas the flat panels offer ease of fabrication. The sides of the card cage skeletal framework may optionally be left open (i.e., no panels) or may also comprise ventilated flat panels, ribs, or corrugated panels as well. Configuration of the ventilated panels is optimized to permit maximum ventilation of the electronic modules which are mounted in the card cage. Provision is made on the rear of the card cage for mounting a COTS backplane to accommodate COTS electronic modules. Further, the card cage may be modified to adsorb energy at a particular frequency to maximize vibration isolation at that frequency, thus providing a tuned vibration adsorption system.

The card cage is equipped with means for mounting vibration isolators for interface to the transit case via vibration/shock isolators. The preferred mounting points are positioned proximal to the eight corners of the skeletal framework, on a linear portion of a member of the frame work. This permits mounting vibration isolators with a minimum impact to transit case size. Alternate isolator mounting points on the skeletal framework of the card cage include points on the linear members of the skeletal framework intermediate to the corners of the framework. Placement of isolator mounting means (e.g., brackets, bolts, screws, holes, pins, clips, straps, and the like) at these locations may be appropriate, for example, when four isolators are used to support and isolate the card cage with the isolators symmetrically disposed in a tetrahedral configuration about the card cage.

The relatively lighter weight of the card cage results, in part, in being able to select lighter, smaller shock and vibration isolators. The isolators may be chosen for isolation of a broad frequency range of vibrations, or alternately, for a narrow range of frequencies. This may be appropriate, for example, in an environment where a single or narrow range of frequencies is predominantly responsible for vibration, such as the constant vibration of a constant speed engine in an aircraft or other vessel. Alternately, the isolators may be selected to reject only those frequencies which occur intermittently but with sufficient amplitude to risk damage to the electronic modules; for example, the high amplitude frequencies associated with a jet aircraft at takeoff. Additionally, more than one isolator may be installed between the card cage and the transit case to suppress a multiple number of frequency ranges, or configured to suppress different frequencies along different axes.

Cooling of the electronic modules may be critical to the electrical stability of the components contained in the modules and to the performance and functionality of the electronics system packaged in the ruggedized container should internal temperatures approach the design specification of the electronics modules. In an environment wherein an open system forced air cooling means is appropriate, fans providing ambient air flow over the electronic modules provide sufficient heat dissipation at the least weight. When a closed cooling system is specified, we have determined that a closed system heat pipe heat exchanger provides sufficient heat dissipation capacity to maintain the temperature inside the card cage to not more than 12° C. above ambient temperature, while weighing less than other closed system cooling means having similar capacities.

While a heat pipe heat exchanger is the preferred cooling means for the ruggedized container of this invention, other cooling means such as thermoelectric, traditional refrigeration, air-to-air heat exchange, and forced air fans are alternate cooling means that may be used in the container of our invention. Notably, a closed air-to-air heat exchanger, while capable of providing better cooling performance than a heat pipe heat exchanger, requires the use of a plate-type heat dissipater having a plurality of very fine, closely spaced fins on the ambient side of the heat exchanger. In a corrosive atmosphere such as a near a salt water environment, these heat fins are susceptible to corrosion with a resulting substantial impact to performance and heat transfer capacity. An advantage of the closed system heat pipe heat exchanger is its relative resistance to performance impact due to corrosion, as compared to a plate fin design, and preclusion from clogging in sand, salt, and dust environments, since the heat pipe heat exchanger need not have heat transfer fins on the ambient side of the heat exchanger. An additional feature of the heat pipe heat exchanger is that the heat pipes are less likely to collect particulate contaminants, and are easier to clean than plate fin type heat exchangers.

The heat pipe heat exchanger is positioned within the ruggedized container to provide air flow around the electronic modules and to ensure sufficient cooling of the modules. Air flow distribution and cooling is facilitated by the open design of the card cage, thus permitting a large volumetric flow of air to be passed across the modules.

The power supply for the ruggedized container of this invention is selected based on weight, as well as its ability to provide power sufficient to supply adequate power to the electronic modules as well as to the cooling system.

The combination of our novel transit case, card cage and shock/vibration isolation system, and the resulting significant weight reduction of the ruggedized container of our invention over that of commercially available units results in a compact, light-weight, ruggedized container for COTS electronic modules. The weight of the container is substantially less than that of commercially available containers, and substantially smaller in size, because of the materials used and the elimination of the inner frame. According to the ruggedized container of the present invention, a means and method are provided for transporting and using COTS electronic modules in harsh environments such as a battlefield, in portable flight-line test applications, and in environments where weight and size may be critical, such as shipboard, aircraft, spacecraft or submarine environments.

BRIEF DESCRIPTION OF DRAWINGS

The invention is illustrated with reference to the drawings in which.

BEST MODE FOR CARRYING OUT THE INVENTION

The following detailed description illustrates the invention by way of example, not by way of limitation of the principles of the invention. This description will clearly enable one skilled in the art to make and use the invention, and describes several embodiments, adaptations, variations, alternatives and uses of the invention, including what I presently believe is the best mode of carrying out the invention.

Figure 1A:
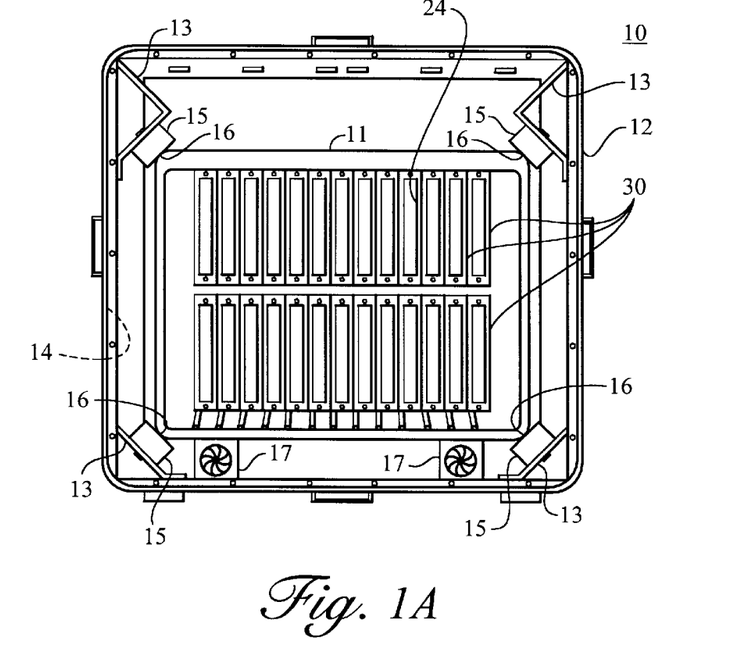
FIG. 1A is a front elevation view of the front of the ruggedized container of this invention with the front cover and front panel removed, and showing an open system forced air cooling system.

Referring to the illustrations, FIG. 1A is a front elevation view of one embodiment of the ruggedized container 10 of this invention. A lightweight card cage 11 of composite material construct is disposed and suspended within a lightweight transit case 12 via vibration isolators 15. The transit case provides a continuous protective shell for the card cage suspended therein.

We have discovered that the materials used in the construction of the transit case significantly affect the overall weight of the ruggedized container. A study was performed to investigate various construction materials to identify the material affording, not only as to light-weight, but also the composite's ability to withstand shock and vibration. Eleven variables which characterize the properties relevant to the selection of a suitable case material were identified, and weighted in accordance with the importance of that variable. The "weight" of the composite material was identified as the most important variable and, therefore, accorded the highest weighting factor. Several composite materials, as well as aluminum composites and deep-drawn aluminum metal, were evaluated and scored against the variables previously identified. The results of the study are shown in Table I below.

TABLE I

TRANSIT CASE MATERIALS STUDY

| Selection Criteria | Weighting Factor | GK | DD w/EF | FRP | TSC | DD/CM | E w/CP |
|---|---|---|---|---|---|---|---|
| Weight | 10 | 100 | 60 | 80 | 90 | 70 | 70 |
| Shock and Vibration Dissipation | 9 | 63 | 81 | 63 | 63 | 90 | 72 |
| Impact Resistance | 8 | 80 | 56 | 80 | 80 | 48 | 64 |
| Thermal Conductivity | 8 | 56 | 80 | 56 | 56 | 80 | 64 |
| NBC Resistance | 7 | 70 | 42 | 70 | 70 | 42 | 49 |
| Producibility | 7 | 56 | 70 | 56 | 63 | 49 | 56 |
| COTS/NDI Availability | 6 | 36 | 60 | 48 | 30 | 30 | 30 |
| Design Flexibility | 6 | 54 | 48 | 54 | 60 | 60 | 54 |
| EMI Shielding | 5 | 40 | 50 | 40 | 35 | 50 | 40 |
| Low Tooling Costs | 5 | 50 | 50 | 50 | 25 | 25 | 30 |
| Production Costs | 5 | 40 | 45 | 40 | 50 | 30 | 30 |
| Total 760 | | 645 | 642 | 637 | 622 | 574 | 559 |

GK = Graphite Kevlar
DD w/EF = Deep drawn aluminum with extruded frame
FRP = Fiberglass reinforced plastic
TSC = Thermostamped composite
DD/CM = Deep drawn aluminum, chemically milled
E w/CP = Aluminum extrusion with composite panels Based on these results, it was determined that a graphite-Kevlar composite was the best option, based on its aggregate score, and in view of the significant weight advantage over deep-drawn aluminum with an extruded frame. Other composites, including fiberglass reinforced plastic, fiberglass reinforced composites, and thermostamped composite, also exhibit scores sufficiently favorable to include these materials as alternate construction materials for the transit case. The preferred embodiment of the transit case uses a fiberglass reinforced Kevlar-graphite composite. Notably, the container of this invention does not include an inner frame to support the card cage as is typically found in commercially available containers, since the card cage of this invention is sufficiently rigid and has sufficient mechanical strength to be attached directly to the transit case via vibration isolators without the need for such supplemental support.

Mounting brackets 13 are attached to the inside wall 14 of the transit case 12 for mounting shock/vibration isolators 15. Isolator attachment means are also provided on the card cage, preferably at points proximal to the corners 16 of the card cage 11. Attachment means include brackets, bolts, holes, eyelets, screws, clips, glue, straps and the like to permit attachment of the card cage to the isolators. Alternately, attachment means may be positioned at any suitable location on the card cage. The combination of the transit case 12 and the card cage 11 connected one to the other via the isolators 15 results in a light-weight, integrated chassis. The card cage is suspended in the transit case, away from the inner wall of the transit case, and, thus, is vibrationally isolated from the transit case.

In the preferred embodiment, eight isolators 15 are mounted at on the linear members of the card cage 11 at locations proximal to each of the eight corners 16 of the rectangular polyhedron to provide vibration and shock isolation in all axes (up-down, front-back, and side-to-side). In an alternately preferred embodiment, the card cage may be connected with only four isolators attached to mid-member locations on the card cage to corresponding transit case isolator mount locations to provide a symmetrical tetrahedral configuration. This configuration will also provide vibrational isolation along all axes. Although fewer than 3 isolators may be used, vibration and shock isolation will necessarily be restricted to less than all axes. FIG. 1A also shows a backplane 24 mounted in the rear of the card cage for removably receiving electronic modules for connection into sockets 30 mounted on the backplane.

Figure 1B:
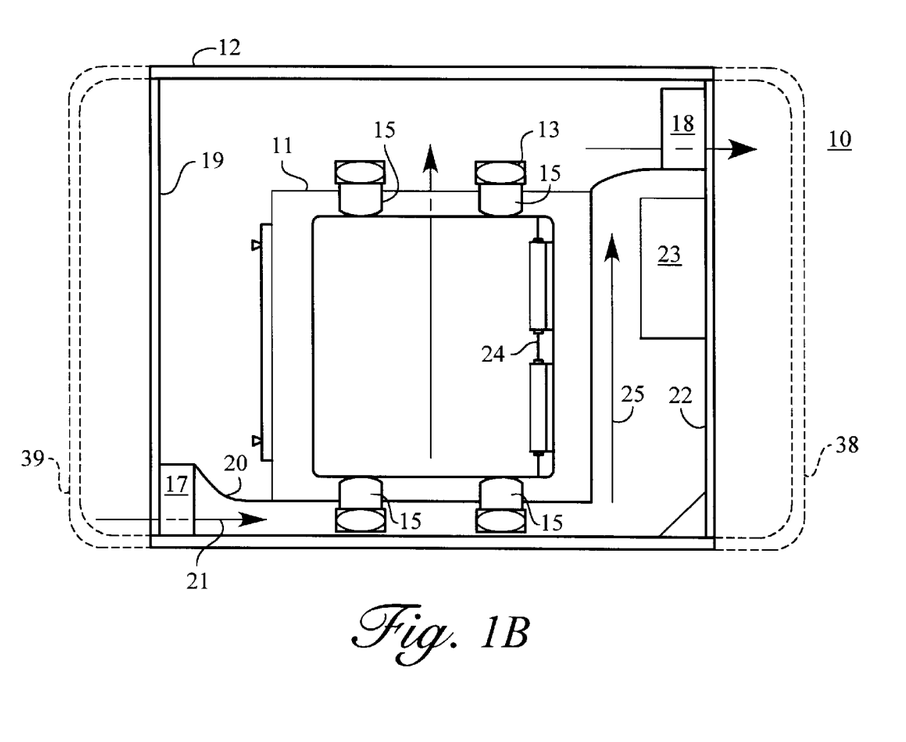
FIG. 1B is a side elevation view of the ruggedized container of this invention showing, generally, placement of the card cage within the transit case and the air flow pattern therethrough, and showing an open system forced air cooling system.

The ruggedized container of FIG. 1A includes an open system forced air cooling means. Fans 17, for open system forced air cooling, are positioned to draw ambient air into the transit case. These circulation fans 17 may be used to provide air cooling of the electronic modules. FIG. 1B is a side elevation, cross-section view of one embodiment of the ruggedized container 10 of this invention. Placement of the fans is discretionary with the only requirement being that fan placement provide sufficient flow of air through the card cage 11 to maintain a predefined cooling performance criteria. The air flowing through the open system forced air cooling scheme shown in FIG. 1B is exhausted out of an exhaust 18. The fans in FIG. 1B are placed at the lower front of the transit case, just inside of the front panel 19. The front and rear covers, 38, 39, shown in phantom, are detached from the case prior to operation. Air is drawn into the case 12 by the fans 17. An optional baffle 20 directs the incoming air to beneath and then through the card cage 11, thus providing convective cooling of electronic modules mounted in the card cage. The air is exhausted through an exhaust port 18 in the back panel. FIG. 1B shows the power supply 23 mounted on the back panel 22 with sufficient space between the power supply and the blackplane 24 to permit cooling air 25 to circulate around the power supply, thereby keeping the power supply cool. An optional filter may be attached to the air intake to limit the amount of airborne contaminants drawn into the transit case.

Figure 2:
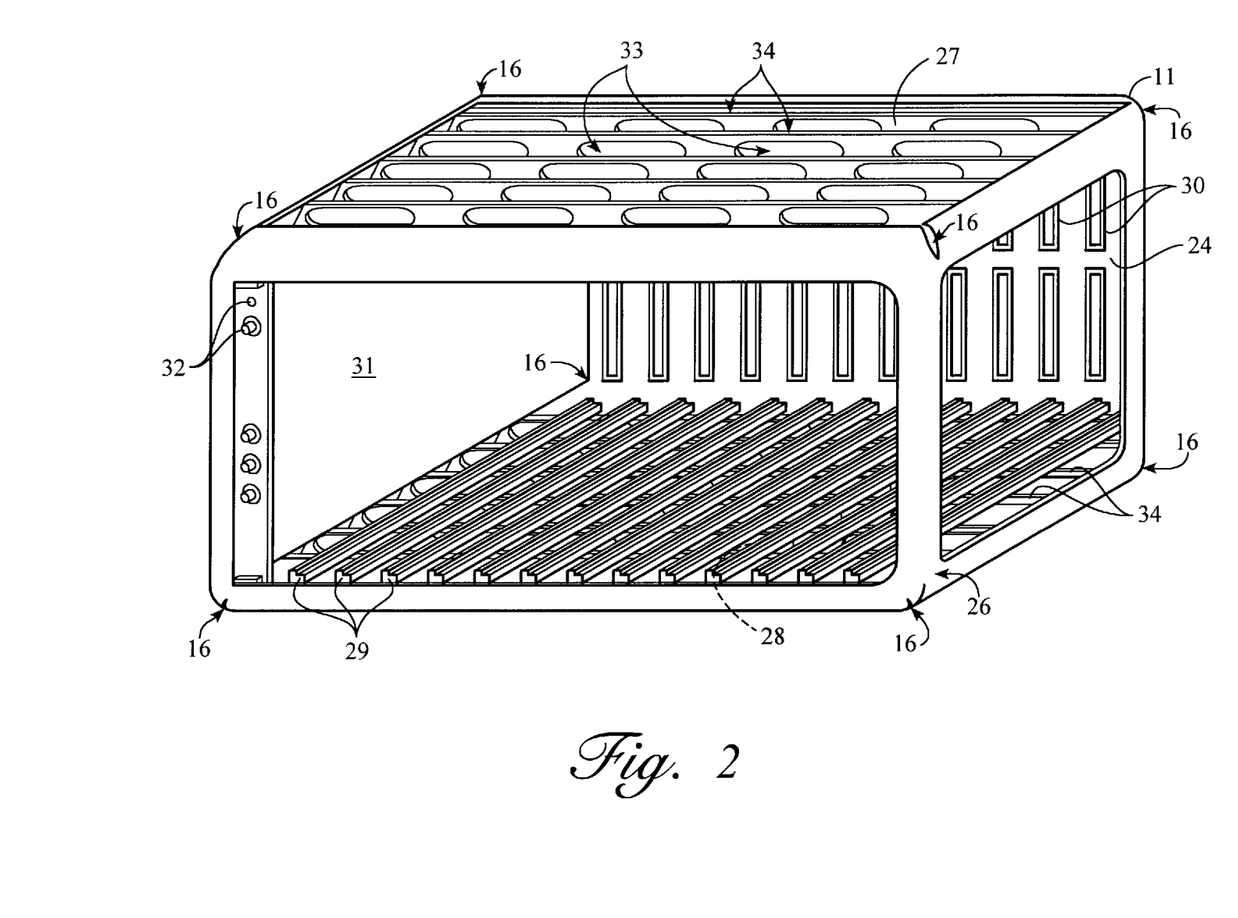
FIG. 2 is a isometric view showing the card cage of this invention.

FIG. 2 is an isometric view of the card cage 11 of this invention. The card cage integrates a composite frame, or skeletal framework 26, with top and bottom ventilated, panels 27, 28, to provide a light-weight, high strength card cage without the need for a separate inner frame for mechanical support. While the preferred panels are corrugated to provide enhanced structural rigidity, the panels may also be flat to facilitate fabrication of the card cage and still attain sufficient rigidity and mechanical strength so as not to require supplemental mechanical support from an inner frame. FIG. 2 shows the preferred embodiment with the sides of the skeletal framework without panels. Card guides, or rails 29, are provided on the bottom panel, and on the top panel (not shown) into which electronic modules 31 may be slidably mounted. A backplane 24 is attached on the rear face of the card cage. The backplane 24 shown in FIG. 2 has sockets 30 for insertion of the electronic modules thereinto to provide a removable electrical connection between the backplane 24 and the electronic modules. An electronic module 31 is shown inserted in the card cage. The controls and connection ports 32 of the module 31 are either electrically passed through the front panel (not shown) by providing electrical feed-throughs, or are physically passed through via access holes cut in the front panel. In the preferred embodiment, cables are run from the electronic module to electrical feed-throughs. This avoids cutting openings in the front panel through which dust, moisture, and other contaminants might enter the system.

By way of construction, the card cage of this invention may be constructed in either of two ways. In the first method, a generally rectangular top frame, and a generally rectangular bottom frame, the same size as the top frame, are constructed from a composite laminate. The linear members of the top and bottom frames have an angular, preferably right angle, or an arcuate cross-section. The right angle cross section of the frame members makes the frame extremely rigid and resistant to flexure resulting from shear, torsional, or bending forces applied to the frames. The top and bottom frames are connected at each of their respective four corners by four, vertically positioned additional linear connecting members, these also having a right angle, or arcuate, cross-section. Each of the four connecting members are bonded to a corner of the top frame and a corresponding corner of the bottom frame to provide a rectangular polyhedron skeletal framework 26 having open top, bottom, sides, front and back. The right angle cross sections of the linear members of the skeletal framework 26 serve to provide an extremely rigid structure. Bonding of the linear members to the frames includes solvent welding, gluing, screwing, riveting, bolts, and combinations of these methods.

The top and bottom frames may be constructed from individual linear members bonded one to another in the manner just described, or, alternately, they may be constructed from a single piece of formed composite laminate. The second method includes constructing the laminated composite on a special form to produce a one-piece, integrated, monolithic skeletal frame. Optionally, top and bottom ventilated panels may be built-in during construction to produce a single-piece, monolithic, completed card cage.

In the preferred embodiment, ventilated top and bottom panels 27, 28 are bonded onto the inside surface of linear members of the skeletal framework 26 defining the top and bottom planar surfaces of the polyhedron. The panels are preferably corrugated to further increase the rigidity of the skeletal framework, although flat panels are alternately preferred. Preferably, the ridges and troughs formed by the corrugation have apertures 33 to permit ventilation. The panels are mounted so that the ridges and troughs run laterally, i.e., from side to side (rather than front to back). Side to side alignment is preferred since the rails 29 used to mount the electronics modules thereon run longitudinally, i.e. front-to-back. Thus, by running the corrugation from side-to-side, lateral or transverse, flexure is minimized. Longitudinal attachment of the slide rails 29 on the corrugated panels 27, 28 adds longitudinal rigidity to the top and bottom panels, thus minimizing longitudinal flexure. The bonding of the top and bottom panels to the top and bottom face of the polyhedron is facilitated by selecting a corrugated panel cross section having flattened peaks and troughs (i.e., approximately rectangular or trapezoidal in cross-section), as opposed to rounded peaks and troughs. These flat areas 34 provide a flat surface area with which the panels may be bonded to the skeletal framework 26. Further, these flat areas facilitates the slide rails 29 to be attached to the panels 27, 28. Slide rails are attached onto the corrugated panels with the rails running longitudinally, i.e. at right angles, to the direction of the ridges in the corrugated panels. The rails provide a slidable retaining means for electronic modules 31 that are plugged into a socket 30 on the backplane 24. Rails 29 are mounted on the inside surface of the top and bottom panel 27, 28, with corresponding rails for a particular socket 30 being directly opposed to one another and both in longitudinal alignment with the socket to permit slidable insertion of a COTS electronic module into the socket. Attachment of the slide rails 29 may be by bonding including gluing, or mechanical attachment such as snaps, clips, screws, bolts, dovetails, and combinations of these methods.

Mounting means on the card cage 11 for attachment of vibration isolators thereto and for interface to the transit case 12 via the vibration isolators 15 permits suspension of the card cage 11 within the transit case 12 to provide protection to the electronic modules against shock and vibration. Although the attachment points on the skeletal framework may be made at an intermediate position on any linear member of the framework, the preferred attachment points are on the linear members proximal to the eight corners of the rectangular polyhedron defining the geometry of the card cage.

The relatively lighter weight of the card cage results in being able to select a lighter, smaller shock and vibration isolator. Further, the elimination of the need to use an inner frame for supplemental support of the card cage, results in further reductions in mass permitting the use of lighter and smaller isolators 15. Means with which to attach the isolators to the attachment points on the card cage include: bolts screws, brackets, glue, clips, straps, holes, eyelets, or a combination of these methods. Once the isolators 15 are attached to the card cage 11 and to the transit case 12, the card cage is suspended in three dimensional spatial alignment within the transit case. In this position, the card cage is removed from the interior wall 14 of the transit case 12 thus providing headspace for unrestricted flow of cooling air. Further any shock or vibration must necessarily travel through the isolators, since no portion of the card cage is in direct contact with the transit case.

The vibration/shock isolators may be chosen for isolation of a broad frequency range of vibrations, or alternately, for a narrow range of frequencies. This may be appropriate, for example, in an environment where a single or narrow range of frequencies is predominantly responsible for vibration, such as the constant vibration of a constant speed engine in an aircraft or other vessel. Alternately, the isolators may be selected to reject only those frequencies which occur intermittently but with sufficient amplitude to risk damage to the electronic modules; for example, the high amplitude frequencies associated with a jet aircraft at takeoff. More than one isolator may be installed between the card cage and the transit case to suppress a multiple number of frequency ranges.

Figure 3A:
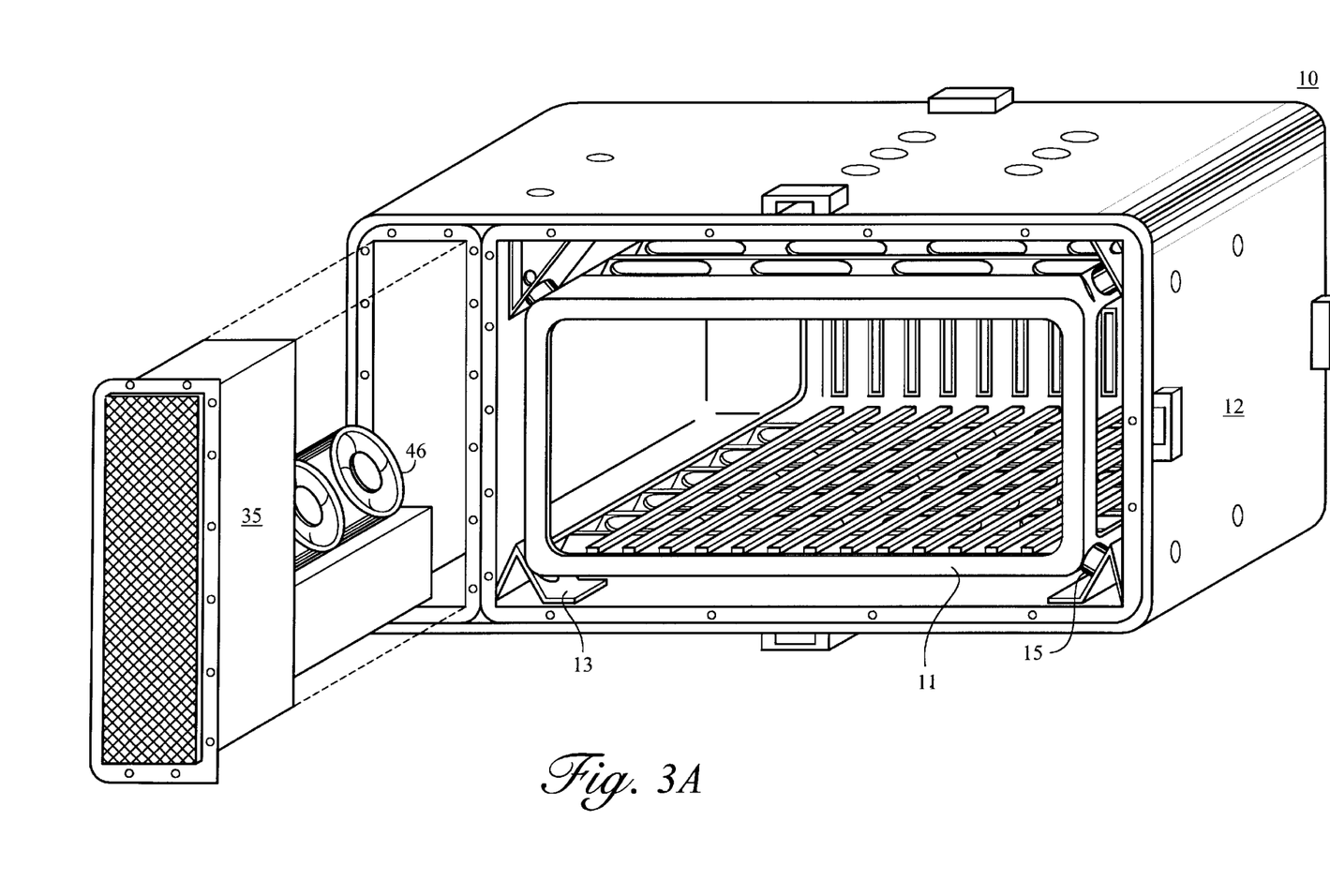
FIG. 3A is an isometric view of the ruggedized container with the front panel and front cover removed with the card cage in position and the cooling means detached therefrom.

An alternate cooling system than that described in conjunction with FIGS. 1A and B may be employed. In the preferred embodiment shown in FIG. 3A, space is provided in the container for a cooling system or unit 35. The cooling system 35 includes but is not limited to a thermoelectric or solid state cooler, traditional air conditioning, closed system heat pipe heat exchanger, and closed system air to air heat exchanger.

A study was performed to determine which cooling method provided the best combination of performance and light-weight. Eight variables were identified with respect to those characteristics most desired in a cooling system for a ruggedized container. Each of the eight variables were ranked, or weighted, in accordance with the priority or importance of that particular variable. The variables and results of the study are shown in Table II below:

TABLE II

OPEN V.S. CLOSED SYSTEM COOLING STUDY

| Selection Criteria | Closed System Air-to-Air Heat Exchanger | | Closed System Heat Pipe Heat Exchanger | | Open System Forced Air (Fans) | | Closed System Thermoelectric (Solid State AC) | | Closed System Traditional Air Conditioning | |
| --- | --- | --- | --- | --- | --- | --- | --- | --- | --- | --- |
| Category (Value) | Rating | Score | Rating | Score | Rating | Score | Rating | Score | Rating | Score |
| Environmental Protection (20) | 10 | 200 | 10 | 200 | 3 | 60 | 9 | 180 | 9 | 180 |
| Cooling Performance (15) | 8 | 120 | 7 | 105 | 8 | 120 | 10 | 150 | 10 | 150 |
| Weight (10) | 7 | 70 | 5 | 50 | 10 | 100 | 3 | 30 | 4 | 40 |
| Ruggedness/Durability* (8) | 7 | 56 | 7 | 56 | 8 | 64 | 6 | 48 | 2 | 16 |
| Reliability/Maintenance* (8) | 9 | 72 | 9 | 72 | 9 | 72 | 8 | 64 | 5 | 40 |
| Size (7) | 5 | 35 | 6 | 42 | 9 | 63 | 2 | 14 | 3 | 21 |
| Cost (5) | 7 | 35 | 7 | 35 | 7 | 35 | 3 | 15 | 5 | 25 |
| Power Required (3) | 7 | 21 | 8 | 24 | 8 | 24 | 0 | 0 | 1 | 3 |
| Score 760 | | | | 609 | | 574 | | 538 | | 501 | | 475 |
| Percentage 100% | | | | 80% | | 76% | | 71% | | 66% | | 63% |

*Based on judgement/vendor comments/past applications

While any of the above methods may be used to cool the electronics in the ruggedized container, the closed system heat pipe heat exchanger is preferred since it provides better resistance to corrosion as compared to a plate fin design, and precludes clogging in sand, salt, and dust environments. Further, heat pipes are less likely to collect particulates, and are easier to clean than plate fin type heat exchangers. While the weight rating of the closed system heat pipe heat exchanger is not as good as the forced air design, modifications may be made to the heat pipe heat exchanger to lighten its weight, such as including lightweight aluminum heat pipe material rather than copper, thinning the walls of the heat pipes, installing light-weight fans, and by thinning the walls of the heat exchanger enclosure.

Figure 3B:
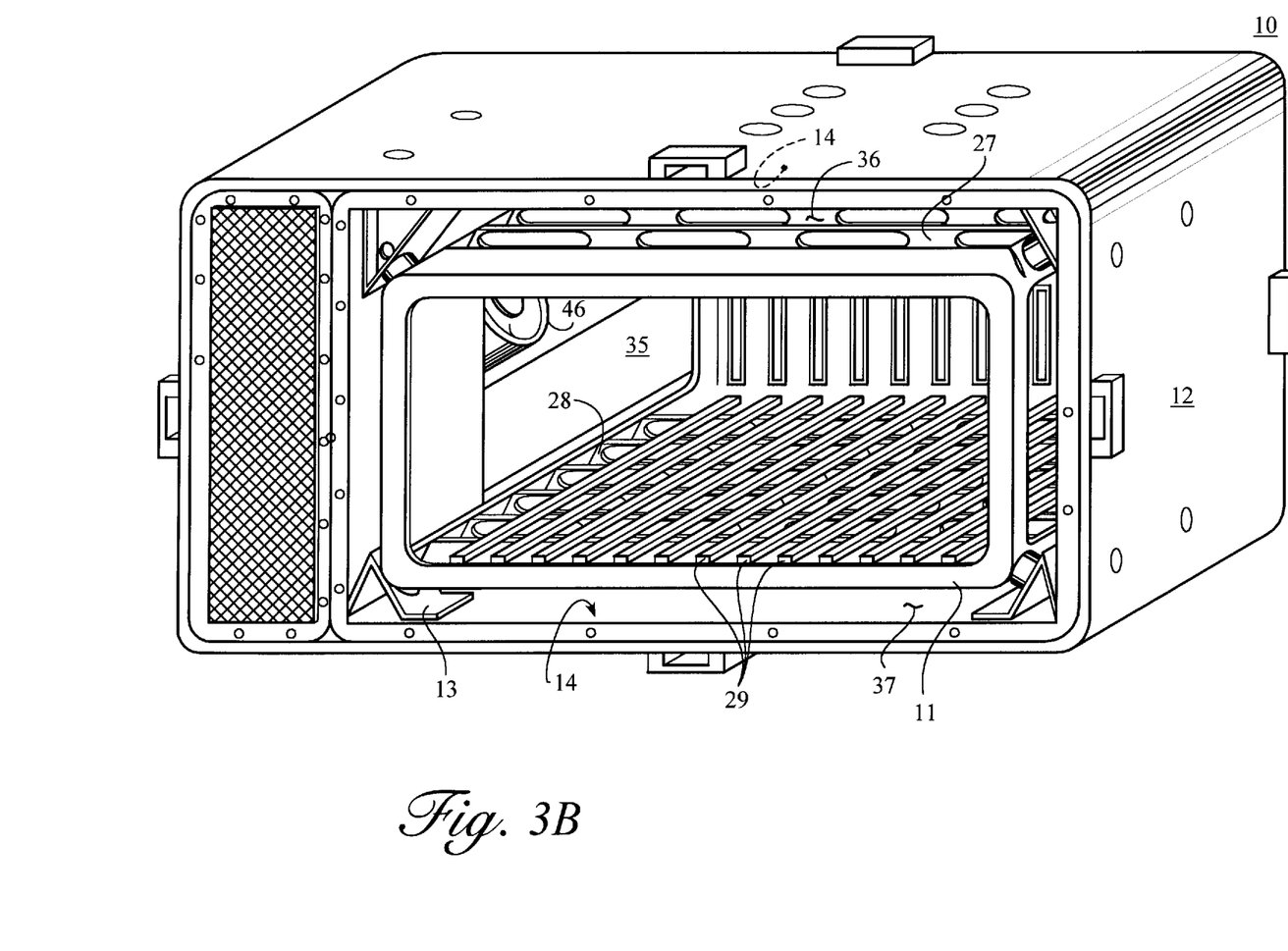
FIG. 3B is an isometric view of the ruggedized container of this container with the front cover and front panel removed.

FIG. 3B shows the cooling unit 35 inserted into the transit case 12. Also shown is the fan 46 aligned in the transit case such that air is directed to the headspace between the inside wall of the top of the transit case and the top panel of the card cage, down and across the electronic modules, and out from underneath the card cage into the headspace 37 between the bottom panel 28 of the card cage 11 and the inside wall 14 of the lower panel of the transit case 12. The circulated air is directed back into the heat exchanger. Note that the intake port, not shown, of the heat exchanger is elevated away from the inside wall 14 of the transit case to create a headspace 37 in the area of the air intake and to minimize restrictions to the air flow as the air re-enters the heat exchanger. It should be noted that the direction of air-flow can be reversed or modified with the only requirement being that sufficient flow of air be directed across the electronic modules to provide sufficient cooling of the modules. On the ambient side of the heat exchanger, outside air is drawn into the heat exchanger unit and across the ambient side of the heat pipes to absorb heat from the heat pipes thus removing heat from the container system and is exhausted back out into the ambient.

Figure 4:
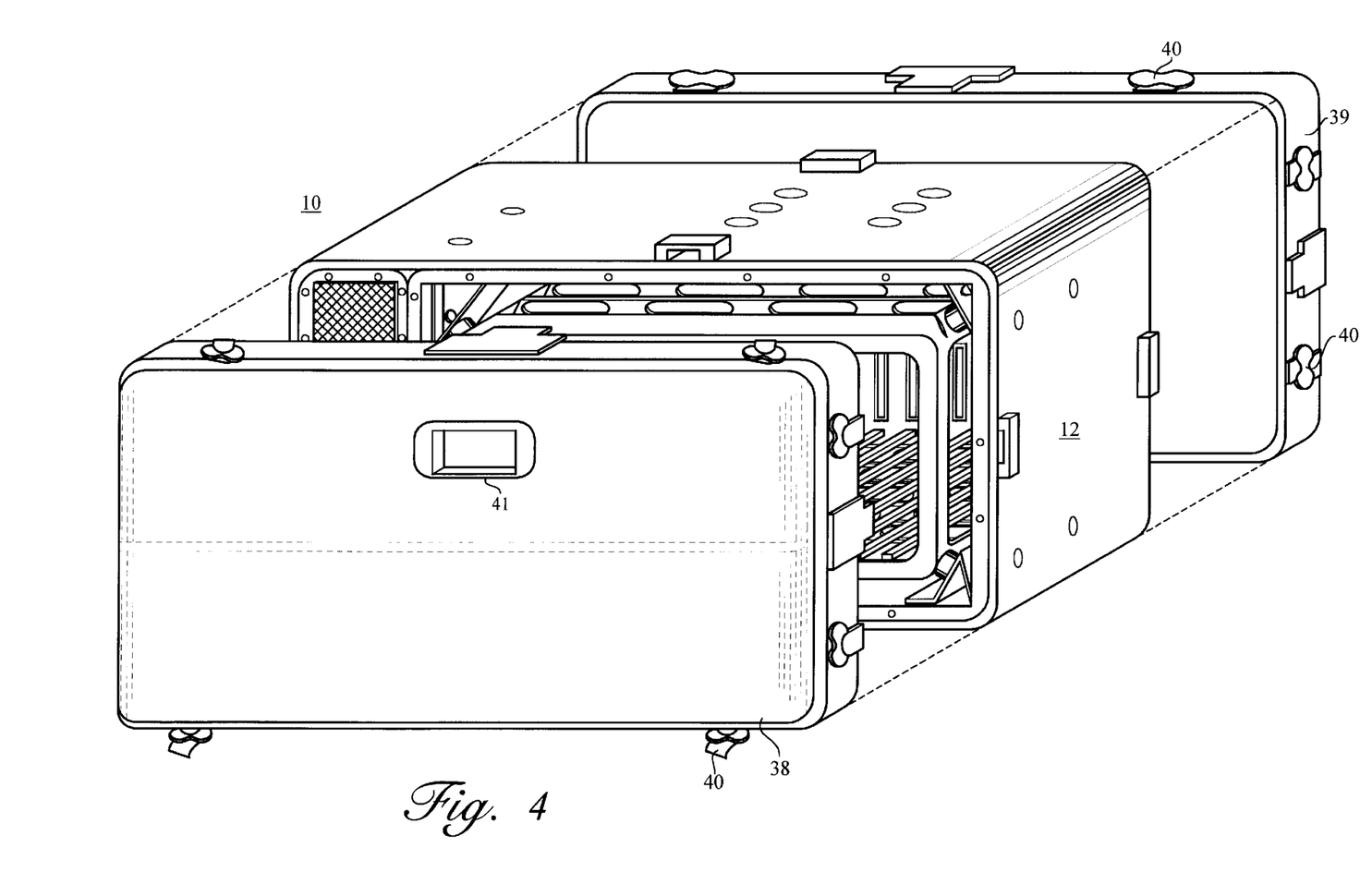
FIG. 4 is an isometric view of the ruggedized container of this invention showing the front and rear transit case covers detached from the transit case and the front panel removed.
Figure 5:
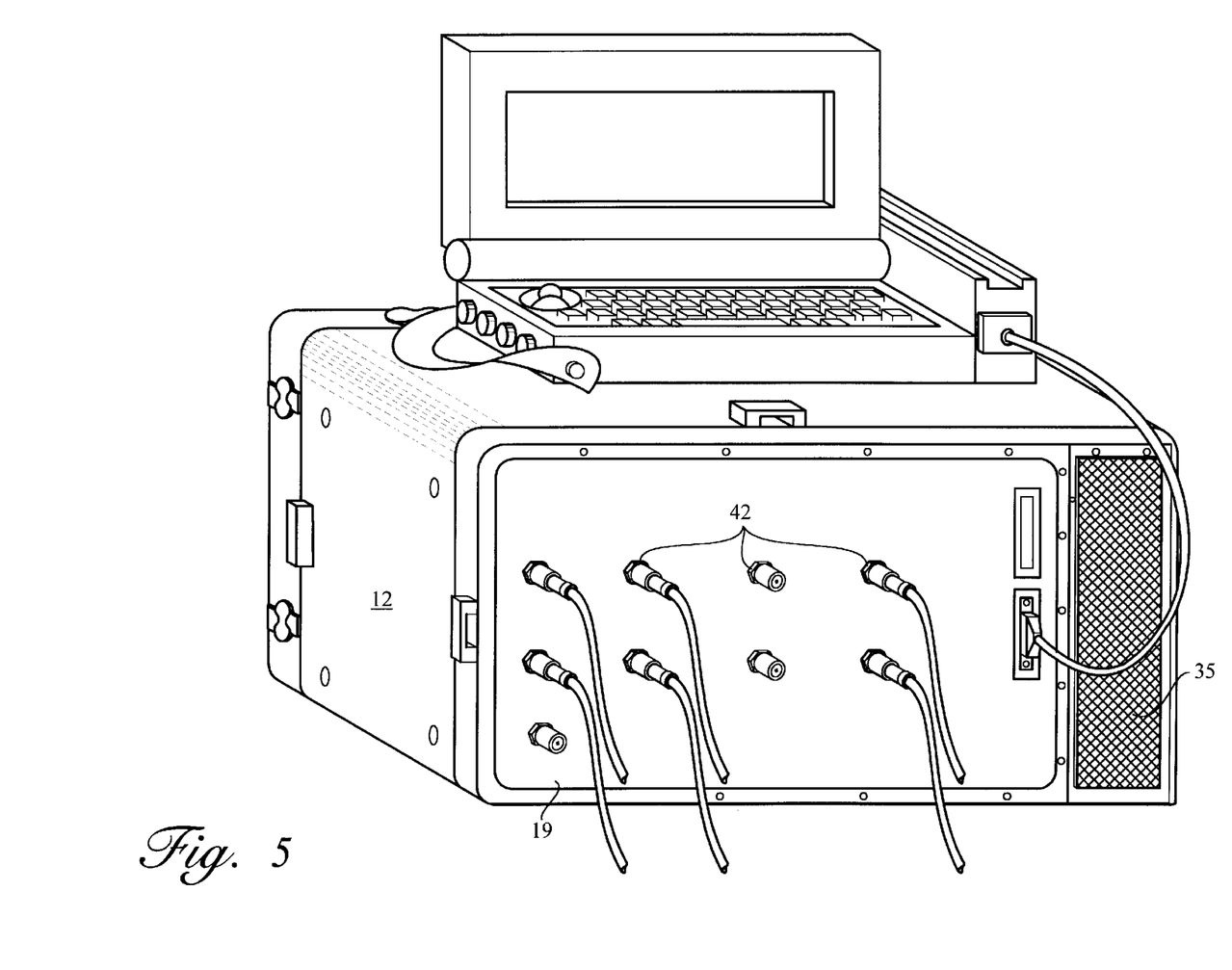
FIG. 5 is an isometric view of the ruggedized container of this invention with the front panel in place and the electronic modules being addressed.

The transit case 12 is provided with front and rear covers 38, 39 as shown in FIG. 4. The front and rear covers are preferably constructed of the same composite as the transit case to provide light-weight, shock resistant covers. The front cover is removably affixed to the front of the transit case 12 and over the front panel 19 (not shown). Similarly, the rear cover 39 is removably affixed to the rear of the transit case, over the rear panel (not shown). Clips or other attachment means, such as hinges, straps, latches 40, and the like may be used to secure the covers to the transit case. Carrying handles 41 are optionally provided to facilitate the lifting of the ruggedized container. FIG. 5 shows the ruggedized container in use with the front cover 38 removed and the front panel 19 in place. Electrical feed-throughs 42 in the front panel 19 permit electrical connectivity of external equipment with the electronic modules contained within the container.

It should be understood that various modifications within the scope of this invention can be made by one of ordinary skill in the art without departing from the spirit thereof. I therefore wish my invention to be defined by the scope of the appended claims as broadly as the prior art will permit, and in view of the specification if need be.

I claim:

1. A container for packaging of electronic equipment, comprising:
    a) a case constructed of a first composite material, said case comprising a continuous shell of said first composite material, said shell defining an inner wall;
    b) a card cage disposed within said case, said card cage constructed of a second light-weight, composite material, said card cage defining apertures to permit flow-through ventilation of air through said card cage, said card cage configured to enable the mounting of at least one electronic circuit mounted therein, said card cage having sufficient rigidity and mechanical strength so as to not require supplemental inner frame support; and
    c) a plurality of vibration/shock isolators, said isolators having a first end attached to said shell of said case, and a second end attached to said card cage to suspend said card cage within said case in approximate fixed spatial alignment away from said inner wall of said case, said isolators providing vibration and shock damping to said card cage, wherein said case further comprises:
    a) a rear panel removably attached to said shell to cover a rear face of said case, said rear panel permitting access to the interior of said case;
    b) a rear cover for removable attachment over said rear panel, said rear cover providing protection against shock and air borne contaminants during handling and transport of the container;
    c) a front panel removably attached to said shell to cover a front face of said case, said front panel permitting access to the interior of said case, said front panel having electrical feed-throughs to permit electrical communication between externally located equipment and said electrical circuits mounted in said card cage; and
    d) a front cover for removable attachment over said front panel, said front cover providing protection against shock and air borne contaminants during handling and transport of the container.

2. A container as in claim 1 further comprising a power supply disposed in said case for providing electrical power to electronic circuits mounted in said card cage.

3. A container as in claim 2 further comprising a cooling unit disposed in said case and proximally located to said card cage, said cooling system aligned to provide flow-through air flow through said card cage and across electronic circuits mounted in said card cage.

4. A container as in claim 1 wherein said first composite is selected from the group of composites consisting essentially of graphite-Kevlar, fiberglass reinforced plastic, fiberglass reinforced composite laminates, thermostamped composite material, and combinations thereof.

5. A container as in claim 1 wherein said second composite material is selected from graphite-Kevlar, fiberglass reinforced plastic, fiberglass reinforced composites, and foam-filled laminate structures thereof.

6. A container as in claim 1 wherein said case includes an electromagnetic interference shield incorporated into said composite shell.

7. A container as in claim 6 wherein said electromagnetic interference shield is selected from the group consisting of:
    a) silver coated rip-stopped nylon, nickel coated rip-stop nylon, metal coated polymer fabrics, metal coated fiberglass, metal mesh, metal foil, and combinations thereof.

8. A container as in claim 1 wherein said card cage is a single-piece, monolithic structure having planar, noncorrugated top and bottom ventilated panels, and a skeletal frame comprising integrated linear members, said linear members having at least one of a right angle and an arcuate cross-section.

9. A container for packaging of electronic equipment, comprising:
    a) a case constructed of a first composite material, said case comprising a continuous shell of said first composite material, said shell defining an inner wall;
    b) a card cage disposed within said case, said card cage constructed of a second light-weight, composite material, said card cage defining apertures to permit flow-through ventilation of air through said card cage, said card cage configured to enable the mounting of at least one electronic circuit mounted therein, said card cage having sufficient rigidity and mechanical strength so as to not require supplemental inner frame support; and c) a plurality of vibration/shock isolators, said isolators having a first end attached to said shell of said case, and a second end attached to said card cage to suspend said card cage within said case in approximate fixed spatial alignment away from said inner wall of said case, said isolators providing vibration and shock damping to said card cage, wherein said card cage further comprises:
a) a top generally rectangular frame having at least one of an angular cross-section and an arcuate cross-section, said cross-section providing increased rigidity and resistance to bending, torsional, and shearing forces;
b) a bottom generally rectangular frame of the same size as said top frame, said bottom frame having at least one of an angular and an arcuate cross section, said cross-section providing increased rigidity and resistance to bending, torsional, and shearing forces;
c) four linear members for permanent attachment to said top frame and to said bottom frame to provide a skeletal framework of open, generally rectangular polyhedron shape, said linear members having at least one of an angular cross-section or an arcuate cross section,
d) a ventilated top panel selected from one of a flat panel and a corrugated panel, said corrugated panel having parallel ridges and troughs, said ridges and troughs having flattened terminus to provide a plurality of parallel flat surfaces, said top panel having a plurality of through-apertures to permit air flow through said top panel, said top panel permanently attached to said skeletal framework to provide an integrated, perforated, top surface of said skeletal frame work;
e) a ventilated bottom panel selected from one of a flat panel and a corrugated panel, said corrugated panel having parallel ridges and troughs, said ridges and troughs having flattened terminus to provide a plurality of parallel flat surfaces, said bottom panel having a plurality of through-apertures to permit air flow through said bottom panel, said bottom panel permanently attached to said skeletal framework to provide an integrated, perforated, bottom surface of said skeletal frame work;
f) a backplane attached to said skeletal framework to provide a rear backplane panel of said skeletal framework, said backplane having a plurality of spatially ordered sockets for electrical connection with said electronic circuits; and
g) a plurality of mounting rails attached to said top panel and to said bottom panel, said rails arranged to permit slidable mounting of electronic circuit modules into said card cage and to permit removable socket connection with said backplane.

10. A container for packaging of electronic equipment, comprising:
a) a case of generally rectangular polyhedron shape having planar top, bottom, and side surfaces, and openings in front and back, said case constructed of a first lightweight composite material, said case forming a continuous composite shell for protection of electronic modules contained therein from shock, rain sand, saltwater, dust, and the like, said case further comprising:
  i) an electromagnetic interference shield integrated into the composite material of said case;
  ii) a plurality of mounting brackets for attachment of vibration/shock isolators thereto;
b) a card cage constructed of a second lightweight composite material, said card cage further comprising:
  i) a generally rectangular top frame, said top frame having at least one of an angular cross-section and an arcuate cross-section,
  ii) a generally rectangular bottom frame, said bottom frame having at least one of an angular cross-section and an arcuate cross section,
  iii) four linear members, each of said members having a first end and a second end, each of said first ends being bonded to a corner of said top frame, each of said rear ends being bonded to a corresponding corner of said rectangular frame to provide a skeletal framework of generally rectangular polyhedron shape, each of said linear members of said skeletal framework having at least one of an angular cross-section and an arcuate cross-section, said angular or arcuate cross section of said linear members providing increased stiffness and rigidity to said skeletal framework,
  iv) a top panel constructed of said second lightweight composite material bonded to the top of said skeletal framework, said top panel selected from a ventilated flat panel and a ventilated corrugated panel, said ventilated corrugated panel having a series of parallel ridges and troughs, the tops of said ridges and the bottoms of said troughs being flat to provide a series of parallel planar areas to permit bonding the top of said skeletal framework with said ridges and troughs aligned transverse to the longitudinal axis of said skeletal framework, said longitudinal axis running from front to back of said skeletal framework,
  v) a bottom panel constructed of said second lightweight composite material bonded to the bottom of said skeletal framework, said bottom panel selected from one of a ventilated flat panel and a ventilated corrugated panel, said corrugated panel having a series of parallel ridges and troughs, the tops of said ridges and the bottoms of said troughs being flat to provide a series of parallel planar areas to permit bonding of said corrugated panel to said bottom of said skeletal framework with said ridges and troughs aligned transverse to the longitudinal axis of said skeletal framework, and
  vi) a plurality of mounting means for attachment of vibration/shock isolators thereto;
c) a plurality of vibration/shock isolators for attachment to said mounting means on said card cage and to said mounting brackets inside said case, said isolators suspending said card cage in said case in an approximately fixed, spaced, spatial alignment to said shell of said case, said isolators attenuating vibration and shock to said electronics mounted in said card cage.

11. A container as in claim 10 further comprising a power supply disposed in said case for providing electrical power to electronic circuits mounted in said card cage.

12. A container as in claim 10 further comprising a cooling unit disposed in said case and proximally located to said card cage, said cooling system aligned to provide flow through air flow through said card cage and across said electronic circuits.

13. A container as in claim 10 wherein said first composite is selected from the group of composites consisting essentially of graphite-Kevlar, fiberglass reinforced plastic, fiberglass reinforced composite laminates, thermostamped composite material, and combinations thereof.

14. A container as in claim 10 wherein said second composite material is selected from the group consisting graphite-Kevlar composite, fiberglass reinforced plastic, fiberglass reinforced composites, and foam-filled laminate structures thereof.

15. A container as in claim 10 wherein said case further comprises:
   a) a rear panel removably attached to said shell to cover a rear face of said case, said rear panel permitting access to the interior of said case;
   b) a rear cover for removable attachment over said rear panel, said rear cover providing protection against shock and air borne contaminants during handling and transport of the container;
   c) a front panel removably attached to said shell to cover a front face of said case, said front panel permitting access to the interior of said case, said front panel having electrical feed-throughs to permit electrical communication between externally located equipment and said electrical circuits mounted in said inner cage; and
   d) a front cover for removable attachment over said front panel, said front cover providing protection against shock and air borne contaminants during handling and transport of the container.

16. A container as in claim 10 wherein said card cage further comprises:
   a) a backplane attached to said skeletal framework to provide a rear backplane panel of said skeletal framework, said backplane having a plurality of spatially ordered sockets for electrical connection with aid electronic circuits; and
   b) a plurality of mounting rails attached to said top panel and to said bottom panel, said rails longitudinally aligned and arranged to permit slidable mounting of electronic circuit modules into said card cage and to permit removable socket connection with said backplane.

17. A container as in claim 10 wherein said electromagnetic interference shield is selected from the group consisting of silver coated rip-stopped nylon, metal coated polymer fabrics, metal coated fiberglass, metal mesh, metal foil, and combinations thereof.

18. A container for packaging of electronic equipment, comprising:
   a) a case means for enclosing the electronic equipment to protect the equipment from shock, said case means constructed of a first composite material said case comprising a continuous shell of said first composite material to define an inner wall;
   b) a card cage means disposed in said case means for removably retaining at least one electronic circuit, said card cage means constructed of a second light-weight, composite material, said card cage means having apertures to permit flow through ventilation of air through said electronic circuits mounted in said card cage, said card cage having sufficient rigidity and mechanical strength so as to not require supplemental inner frame support; and
   c) a plurality of vibration/shock isolation means, said isolation means attached to said shell of said case, and attached to said card cage to suspend said card cage within said case in approximate fixed spatial alignment away from said inner wall of said case, said isolation means providing vibration and shock isolation to said card cage means, wherein said case further comprises:
   a) a rear panel removably attached to said shell to cover a rear face of said case, said rear panel permitting access to the interior of said case;
   b) a rear cover for removable attachment over said rear panel, said rear cover providing protection against shock and air borne contaminants during handling and transport of the container;
   c) a front panel removably attached to said shell to cover a front face of said case, said front panel permitting access to the interior of said case, said front panel having electrical feed-throughs to permit electrical communication between externally located equipment and said electrical circuits mounted in said inner cage; and
   d) a front cover for removable attachment over said front panel, said front cover providing protection against shock and air borne contaminants during handling and transport of the container.

19. A container as in claim 18 further comprising means for supplying electrical power to at least said electronic circuits, said power supply means being disposed inside said case.

20. A container as in claim 19 further comprising a cooling means disposed in said case and proximally located to said card cage, said cooling system aligned to provide flow through air flow through said card cage and across said electronic circuits.

21. A container as in claim 20 wherein said cooling means is selected from at least one of a heat pipe heat exchanger, an air-to-air heat exchanger, an open forced air system, thermoelectric cooling/heating system, and traditional air conditioning.

22. A container as in claim 18 wherein said first composite is selected from the group of composites consisting essentially of graphite-Kevlar, fiberglass reinforced plastic, fiberglass reinforced composites, thermostamped composite material, and combinations thereof.

23. A container as in claim 18 wherein said second composite material is selected from the group consisting of graphite-Kevlar composite, fiberglass reinforced plastic, fiberglass reinforced composites, and foam-filled laminate structures thereof.

24. A container as in claim 18 wherein said case means includes an electromagnetic interference shield incorporated into said composite shell.

25. A container as in claim 24 wherein said electromagnetic interference shield is selected from the group consisting of:
   a) silver coated rip-stopped nylon, metal coated polymer fabrics, metal coated fiberglass, metal mesh, metal foil, and combinations thereof.

26. A method for providing packaging of electronic equipment, the method comprising the steps of:
   a) providing a case constructed from a first composite material, said case comprising a continuous shell of said first composite material of a generally rectangular polyhedron shape, said shell defining an inner wall;
   b) suspending a card cage within said case in approximate fixed, spaced, spatial alignment, said card cage constructed of a second light-weight, composite material, said card cage having apertures to permit flow through ventilation of air through said card cage, said card cage having sufficient rigidity and mechanical strength so as to not require supplemental inner frame support; and c) vibrationally isolating said card cage to said shell via a plurality of vibration/shock isolators, said isolators having a first end attached to said shell of said case, and a second end attached to said card cage to suspend said card cage within said case in approximate fixed spatial alignment away from said inner wall of said case, said isolators providing vibration and shock isolation to said card cage, wherein said case further comprises:
  a) a rear panel removably attached to said shell to cover a rear face of said case, said rear panel permitting access to the interior of said case;
  b) a rear cover for removable attachment over said rear panel, said rear cover providing protection against shock and air borne contaminants during handling and transport of the container;
  c) a front panel removably attached to said shell to cover a front face of said case, said front panel permitting access to the interior of said case, said front panel having electrical feed-throughs to permit electrical communication between externally located equipment and said electrical circuits mounted in said inner cage; and
  d) a front cover for removable attachment over said front panel, said front cover providing protection against shock and air borne contaminants during handling and transport of the container.

27. A method for providing packaging of electronic equipment as in claim 26 further comprising the step of supplying power to the container, said power provided by a power supply disposed in said case.

28. A method for providing packaging of electronic equipment as in claim 26 further comprising the step of cooling said electrical circuits using a cooling means disposed in the case and proximally located to the card cage, said cooling means aligned to provide flow-through air flow through the card cage and across said electronic circuits.

29. A method for providing packaging of electronic equipment as in claim 26 wherein said first composite is selected from the group of composites consisting essentially of graphite-Kevlar, fiberglass reinforced plastic, fiberglass reinforced composites, thermostamped composite material, and combinations thereof.

30. A method for providing packaging of electronic equipment as in claim 26 wherein said second composite material is selected from the group consisting essentially of graphite-Kevlar, fiberglass reinforced plastics, fiberglass reinforced composites, and foam-filled laminate structures thereof.

31. A method for providing packaging of electronic equipment as in claim 26 wherein said case includes an electromagnetic interference shield incorporated into said composite shell.

32. A container as in claim 31 wherein said electromagnetic interference shield is selected from the group consisting of silver coated rip-stopped nylon, metal coated polymer fabrics, metal coated fiberglass, metal mesh, metal foil, and combinations thereof.

33. A method for providing packaging of electronic equipment, the method comprising the steps of:
  a) providing a case constructed from a first composite material, said case comprising a continuous shell of said first composite material of a generally rectangular polyhedron shape, said shell defining an inner wall;
  b) suspending a card cage within said case in approximate fixed, spaced, spatial alignment, said card cage constructed of a second light-weight, composite material, said card cage having apertures to permit flow through ventilation of air through said card cage, said card cage having sufficient rigidity and mechanical strength so as to not require supplemental inner frame support; and
  c) vibrationally isolating said card cage to said shell via a plurality of vibration/shock isolators, said isolators having a first end attached to said shell of said case, and a second end attached to said card cage to suspend said card cage within said case in approximate fixed spatial alignment away from said inner wall of said case, said isolators providing vibration and shock isolation to said card cage, wherein said card cage further comprises:
  a) a top generally rectangular frame having at least one of an angular cross-section and an arcuate cross-section, said cross-section providing increased rigidity and resistance to bending, torsional, and shearing forces;
  b) a bottom generally rectangular frame of the same size as said top frame, said bottom frame having at least one of an angular and an arcuate cross section, said cross-section providing increased rigidity and resistance to bending, torsional, and shearing forces;
  c) four linear members for permanent attachment to said top frame and to said bottom frame to provide a skeletal framework of open, generally rectangular polyhedron shape, said post members having at least one of an angular cross-section or an arcuate cross section,
  d) a ventilated top panel bonded to said top frame, said top panel selected from one of a ventilated flat panel and a ventilated corrugated panel, said corrugated panel having parallel ridges and troughs, said ridges and troughs having flattened terminus to provide a plurality of parallel flat surfaces to permit bonding to said top frame, said top panel having a plurality of through-apertures to permit air flow through said panel;
  e) a ventilated bottom panel bonded to said bottom frame, said bottom panel selected from one of a ventilated flat panel and a ventilated corrugated panel, said corrugated panel having parallel ridges and troughs, said ridges and troughs having flattened terminus to provide a plurality of parallel flat surfaces to permit bonding to said bottom frame, said bottom panel having a plurality of through-apertures to permit air flow through said bottom panel;
  f) a backplane attached to said skeletal framework to provide a rear backplane panel of said skeletal framework, said backplane having a plurality of spatially ordered sockets for electrical connection with said electronic circuits; and
  g) a plurality of mounting rails attached to said top panel and to said bottom panel, said rails being arranged to permit slidable mounting of electronic circuit modules into said card cage and to permit removable socket connection with said backplane.

34. A card cage for mounting electrical circuits therein, comprising in operative combination:
  a) a skeletal framework of linear members constructed of a light-weight composite, said linear members having a cross-section of one of an approximately angular cross-section and an arcuate cross-section to provide a rigid, mechanically strong card cage;
  b) a top panel constructed of said light-weight composite, said top panel bonded to said skeletal framework; and
  c) a bottom panel constructed of said light-weight composite, said bottom panel bonded to said skeletal framework, wherein said top panel is corrugated to form a series of parallel ridges and troughs in said top panel, the tops of said ridges and the bottoms of said troughs being flat to provide a series of parallel planar areas, said panel being bonded to the top of said skeletal framework with said ridges and troughs aligned transverse to the longitudinal axis of said skeletal framework, said longitudinal axis running from front to back of said skeletal framework.

35. A card cage as in claim 34 wherein said skeletal framework further comprises:
 a) a generally rectangular top frame constructed of a lightweight composite material, said top frame having at least one of an angular cross-section and an arcuate cross-section,
 b) a generally rectangular bottom frame constructed of said light-weight composite material, said bottom frame having at least one of an angular cross-section and an arcuate cross section, and
 c) four linear members constructed of said light-weight composite material, each of said members having a first end and a second end, said linear member having at least one of an angular cross-section and an arcuate cross-section to enhance stiffness and rigidity of said linear members, each of said first ends being bonded to a corner of said top frame, each of said rear ends being bonded to a corresponding corner of said bottom rectangular frame to provide a rigid, mechanically strong skeletal framework.

36. A card cage as in claim 34 further comprising a plurality of mounting means for attachment of vibration/shock isolators thereto.

37. A card cage as in claim 34 wherein said top panel and said bottom panel are ventilated with through-apertures to facilitate air flow through the card cage.

38. A card cage as in claim 34 wherein said skeletal framework and said top and bottom panels are of unitary construction to provide a single-piece, monolithic card cage.

39. A card cage as in claim 34 wherein said skeletal framework comprises:

a) a front frame, a rear frame, and first and second side frames, said front, rear, and side frames being generally rectangular in shape and having at least one of an angular cross-section and an arcuate cross-section, said cross-section providing increased rigidity and resistance to bending, torsional, and shearing forces, each of said frames having top and bottom horizontal linear members, and vertical linear members; and
 b) said front, rear and side frames being bonded together along their vertical linear members to provide a one-piece skeletal framework.

40. A card cage as in claim 34 wherein said top and bottom panels are ventilated flat panels, said top panel being bonded to said top horizontal members of said skeletal framework, and said bottom panel being bonded to said bottom horizontal members to provide a one-piece, card cage.

41. A card cage for mounting electrical circuits therein, comprising in operative combination:
 a) a skeletal framework of linear members constructed of a light-weight composite, said linear members having a cross-section of one of an approximately angular cross-section and an arcuate cross-section to provide a rigid, mechanically strong card cage;
 b) a top panel constructed of said light-weight composite, said top panel bonded to said skeletal framework; and
 c) a bottom panel constructed of said light-weight composite, said bottom panel bonded to said skeletal framework,
 wherein said bottom panel is corrugated to form a series of parallel ridges and troughs in said top panel, the tops of said ridges and the bottoms of said troughs being flat to provide a series of parallel planar areas, said panel being bonded to the bottom of said skeletal framework with said ridges and troughs aligned transverse to the longitudinal axis of said skeletal framework.

\* \* \* \* \*